US006211019B1

(12) United States Patent
Klose et al.

(10) Patent No.: US 6,211,019 B1
(45) Date of Patent: Apr. 3, 2001

(54) READ-ONLY MEMORY CELL DEVICE AND METHOD FOR ITS PRODUCTION

(75) Inventors: Helmut Klose; Emmerich Bertagnolli, both of München (DE)

(73) Assignee: Infineon - Technologies AG, Munich (DE)

( * ) Notice: Subject to any disclaimer, the term of this patent is extended or adjusted under 35 U.S.C. 154(b) by 0 days.

(21) Appl. No.: 09/130,051

(22) Filed: Aug. 6, 1998

Related U.S. Application Data

(63) Continuation of application No. PCT/DE97/00239, filed on Feb. 6, 1997.

(30) Foreign Application Priority Data

Feb. 6, 1996 (DE) .............................................. 196 04 260

(51) Int. Cl.[7] .............................................. H01L 21/8234

(52) U.S. Cl. .......................... 438/275; 438/270; 437/28; 257/390

(58) Field of Search .................................... 438/275, 270; 257/390; 437/28

(56) References Cited

U.S. PATENT DOCUMENTS

| 4,151,020 | | 4/1979 | McElroy | 438/275 |
| 4,905,062 | | 2/1990 | Esquivel et al. | 257/316 |
| 5,308,777 | | 5/1994 | Hong | 438/278 |
| 5,397,727 | * | 3/1995 | Lee et al. | 437/28 |
| 5,920,778 | * | 7/1999 | Rosner et al. | 438/270 |
| 5,973,373 | * | 10/1999 | Krautschneider et al. | 257/390 |
| 6,043,543 | * | 3/2000 | Klose | 257/390 |

FOREIGN PATENT DOCUMENTS

| 44 34 725 C1 | 5/1996 | (DE) . |
| 44 37 581 A1 | 5/1996 | (DE) . |
| 0 503 205 A2 | 9/1992 | (EP) . |
| 1-235269 | 9/1989 | (JP) . |

OTHER PUBLICATIONS

"Self–Aligned N and P Diffused Regions with Submicrometer Trenches", Technical Disclosure Bulletin, vol. 32, No. 10A, Mar. 1990.

"A 3.6 $\mu m^2$ Memory Cell Structure for 16MB EPROMS" (Hisamune et al.), dated Dec. 3, 1989, IEDM, pp. 583–586.

"A 256 kbit ROM with Serial ROM Cell Structure" (Cuppens et al.), IEEE Journal of Solid State Circuits, vol. 18, No. 3, Jun. 1983, pp. 340–344.

"High–Density C–MOS Read–Only Memories for a Hand–held Electronics Language Translator" (Kamuro et al.), IEEE Transactions on Consumer Electronics, vol. CE 27, No. 4, Nov. 1981, pp. 605–609.

* cited by examiner

Primary Examiner—Richard Elms
Assistant Examiner—Pho Luu
(74) Attorney, Agent, or Firm—Herbert L. Lerner; Laurence A. Greenberg; Werner H. Stemer

(57) ABSTRACT

A read-only memory cell device includes a substrate formed of semiconductor material and having a main area. Memory cells in the vicinity of the main area are disposed in matrix form in columns and rows in a cell field. Each memory cell has in each case at least one MOS transistor with a source region, a drain region, a channel region, a gate dielectric and a gate electrode. The MOS transistors of a column are connected in series one after the other. Each column is connected to a bit line and the gate electrodes of the MOS transistors of a row are connected to a word line. The source and drain regions of the MOS transistors of a column are formed in source/drain webs running substantially parallel to one another at a predetermined spacing, are electrically insulated from one another, are produced from the semiconductor material of the substrate and have a predetermined web depth, starting from the main area of the substrate. The word lines for connection of the gate electrodes of the MOS transistors run transversely with respect to the longitudinal direction of the source/drain webs.

11 Claims, 5 Drawing Sheets

US 6,211,019 B1

READ-ONLY MEMORY CELL DEVICE AND METHOD FOR ITS PRODUCTION

CROSS-REFERENCE TO RELATED APPLICATION

This application is a continuation of International Application No. PCT/DE97/00239, filed on Feb. 6, 1997, which designated the United States.

BACKGROUND OF THE INVENTION

Field of the Invention

The invention relates to a read-only memory cell device and a method for the production of a read-only memory cell device including a substrate formed of semiconductor material and having a main area, memory cells disposed in the vicinity of the main area in matrix form in columns and rows in a cell field, each memory cell having in each case at least one MOS transistor with a source region, a drain region, a channel region, a gate dielectric and a gate electrode, the MOS transistors of a column connected in series one after the other, each column connected to a bit line and the gate electrodes of the MOS transistors of a row connected to a word line.

Read-only memory cell devices of the generic type are disclosed, for example, in an article entitled "A 256 kbit ROM with Serial ROM Cell Structure", by R. Cuppens and L. H. M. Sevat, in IEEE Journal of Solid-State Circuits, Vol. SC-18, No. 3, June 1983, pages 340–344; and in an article entitled "High Density CMOS Read-Only Memories for a Handheld Electronics Language Translator", by S. Kamuro et al., in IEEE Transactions on Consumer Electronics, Vol. CE-27, No. 4, November 1981, pages 605 et seq. In those read-only memories a serially interconnected memory cell configuration having a NAND circuit configuration is used for the purpose of increasing the storage density per unit area. The formation of contact holes in the memory cell field can be avoided, as a result of which a very small ROM memory cell can be produced. However, it is necessary to accept a reduced access speed as compared with read-only memories which have a parallel-connected memory cell configuration with a NOR circuit configuration. However, for the purpose of storing considerable volumes of data in many of today's electronic systems, the primary feature is a maximum storage density. That is necessary in order to be able to accommodate a maximum number of memory cells per unit area with sufficiently low process costs to realize a corresponding cost advantage. In the case of the known ROM or OTP memory cells, it is possible to achieve a cell size of $5F^2$ with customary CMOS technologies using a serial circuit configuration of the memory cells in a NAND cell configuration. F denotes the smallest structure size that can be produced or resolved with the respective technology.

Moreover, further-developed read-only memory cell devices and methods for their production have been disclosed, for example, in German Patent DE 44 34 725 C1 and in German Published, Non-Prosecuted Patent Application DE 44 37 581 A1 having the same corporate assignee as the instant application. In those devices, memory cell transistors are constructed in a configuration which is vertical with respect to the main area of the silicon substrate. Such read-only memory cell devices, which are more advanced but are more complicated to produce, have a storage density of $2F^2$ cells.

SUMMARY OF THE INVENTION

It is accordingly an object of the invention to provide a read-only memory cell device and a method for the production of a read-only memory cell device, which overcome the hereinafore-mentioned disadvantages of the heretofore-known devices and methods of this general type and which afford simpler and more cost-effective production in conjunction with a high packing density of the memory cells and a high yield.

With the foregoing and other objects in view there is provided, in accordance with the invention, a read-only memory cell device, comprising a substrate formed of semiconductor material and having a main area; bit lines and word lines; memory cells disposed in matrix form in columns and rows in a cell field in the vicinity of the main area, each of the memory cells having at least one MOS transistor with a source region, a drain region, a channel region, a gate dielectric and a gate electrode, the MOS transistors of a column connected in series one after the other, each column connected to a bit line and the gate electrodes of the MOS transistors of a row connected to a word line; source/drain webs running substantially parallel to one another at a predetermined spacing, electrically insulated from one another, produced from the semiconductor material of the substrate and having a longitudinal direction and a predetermined web depth starting from the main area of the substrate, the source and drain regions of the MOS transistors of a column formed in the source/drain webs; and the word lines for connection of the gate electrodes of the MOS transistors running transversely relative to the longitudinal direction of the source/drain webs.

Accordingly, an essential feature of the invention is that of providing a memory cell configuration which has crossing source/drain and gate paths and the possibility of a cell size of $1F^2$ instead of the heretofore maximum possible storage density of $2F^2$, thereby enabling precisely one memory cell to be realized per base area $F^2$.

In accordance with another feature of the invention, the drain region, formed in the main area of a source/drain web, of an MOS transistor of a column, simultaneously constitutes the source region of that MOS transistor of the same column which is directly adjacent on the source/drain web. In this way, the memory cells can be constructed in a so-called NAND circuit configuration, which enables a particularly high storage density in conjunction with a cell structure that is technologically simple to produce.

In accordance with a further feature of the invention, the ratio of the web width which is measured on the main area transversely with respect to the longitudinal direction of the web, to the spacing between the source/drain webs, is about 20% to 40%, in particular about one third, of the resolvable structure size F. In the case of a maximum structure size F of about 1 µm, which is essentially predetermined by the resolution of the photographic technique being used, the width of the source/drain web is preferably about 0.3 µm given a spacing between the source/drain webs corresponding to the resolvable structure size F, that is to say likewise about 1 µm. With a planar structure of the memory cells, these dimensions yield the maximum possible memory cell density, with conventional lithographic technologies, of precisely one memory cell per base area $F^2$.

In accordance with an added feature of the invention, the structure of the read-only memory cell device has serially connected memory transistors in a NAND cell configuration, and each of the MOS transistors of a memory cell which are formed on the main area of the source/drain webs is programmed as a depletion-mode transistor or an enhancement-mode transistor.

In accordance with an additional feature, the invention is suitable both for the production of one-time electrically programmable read-only memories, in which the gate dielectric has, in particular, an ONO forming material (a so-called OTP or One-Time-Programmable memory) or, as an alternative, for the production of mask-programmable read-only memories (a so-called mask-programmable ROM or Read-Only-Memory), in which the gate dielectric has, in particular, a gate oxide.

In accordance with yet another feature of the invention, the space region between the source/drain webs is filled with an electrically insulating material, in particular a material containing $SiO_2$.

With the objects of the invention in view, there is also provided a method for the production of a read-only memory cell device including a substrate formed of semiconductor material and having a main area, memory cells disposed in the vicinity of the main area in matrix form in columns and rows in a cell field, each memory cell having at least one MOS transistor with a source region, a drain region, a channel region, a gate dielectric and a gate electrode, the MOS transistors of a column connected in series one after the other, each column connected to a bit line and the gate electrodes of the MOS transistors of a row connected to a word line, which comprises forming the source and drain regions of the MOS transistors of a column in source/drain webs running substantially parallel to one another at a predetermined spacing, electrically insulated from one another, produced from the semiconductor material of the substrate and having a longitudinal direction and a predetermined web depth starting from the main area of the substrate; and running the word lines for the connection of the gate electrodes of the MOS transistors transversely relative to the longitudinal direction of the source/drain webs.

In accordance with another mode of the invention, in the production of the read-only memory cell device, both the production of the source/drain webs which have a predetermined web width, and the production and/or adjustment of the source and drain regions running in the main area in the longitudinal direction of the source/drain webs, in each case take place by using a self-aligning method step, through the use of spacers, which are subsequently used as a "hard" mask for structuring the layers lying underneath. The twice repeated application of successive spacer technologies in mutually orthogonal directions parallel to the main area of the substrate results in the formation of a periodic configuration of the memory cells having the smallest resolvable structure size F with precisely one memory cell per base area $F^2$.

In accordance with a further mode of the invention, each self-aligning method step has the following substeps:
  deposition of a masking layer on the main area of the substrate composed of semiconductor material,
  deposition and structuring of an auxiliary layer on the masking layer,
  whole-area deposition of a spacer layer on the structured auxiliary layer and etching back of the spacer layer to form spacers disposed on the sides of the structured auxiliary layer,
  removal of the structured auxiliary layer, leaving the spacers behind in the process, and
  etching of the masking layer using the spacers as an etching mask.

In accordance with a concomitant mode of the invention, in the self-aligning method step, to be carried out first, for the production of the source/drain webs, the structured masking layer can be used as an etching mask, while in the self-aligning method step, to be carried out subsequently, for the production of the source and drain regions, the structured masking layer can be used as an implantation covering mask.

It lies within the scope of the invention to form MOS transistors for driving the memory cell device at the periphery on the substrate, at the same time as the production of the cell field of the memory cell device. The gate oxide and the gate electrodes of the MOS transistors in the periphery can in this case be formed by using the same process steps as the gate oxide and the gate electrodes in the cell field.

Other features which are considered as characteristic for the invention are set forth in the appended claims.

Although the invention is illustrated and described herein as embodied in a read-only memory cell device and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
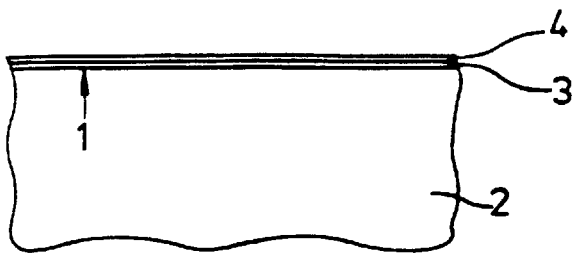
FIG. 1 is a fragmentary, diagrammatic, sectional view of a read-only memory cell device, to be formed on a p-type silicon wafer, according to an exemplary embodiment of the invention, after deposition of a $SiO_2$ and $Si_3N_4$ layer serving as a masking layer.
Figure 2:
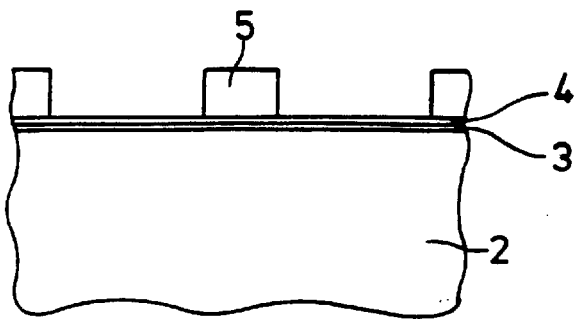
FIG. 2 is a fragmentary, sectional view of the wafer after deposition and structuring of a CVD $SiO_2$ layer serving as an auxiliary layer.
Figure 3:
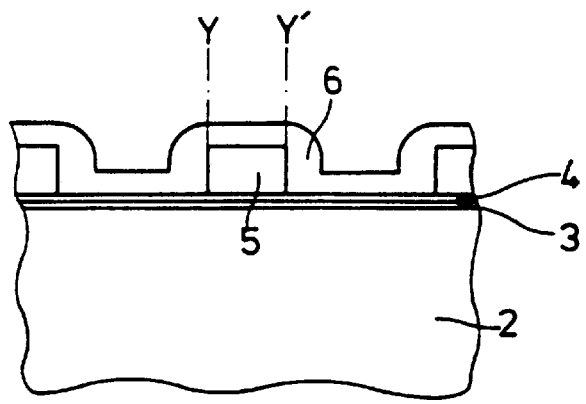
FIG. 3 is a fragmentary, sectional view of the wafer after deposition of a polysilicon layer from which the spacers are formed.
Figure 4:
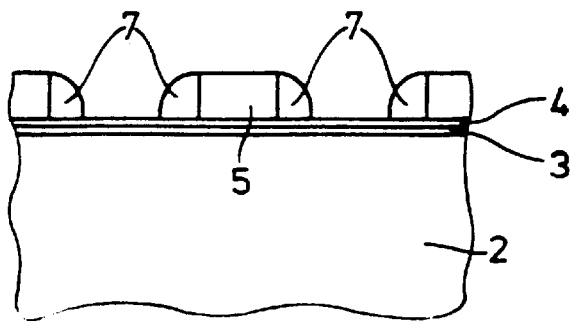
FIG. 4 is a fragmentary, sectional view of the wafer after anisotropic etching of the polysilicon layer.
Figure 5:
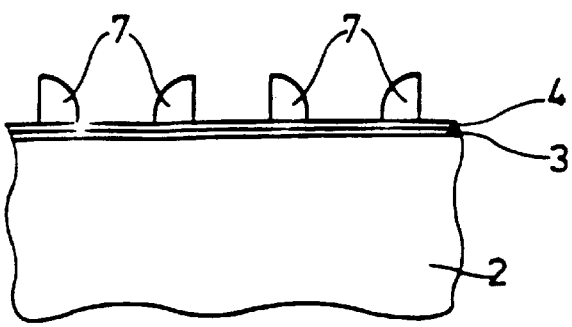
FIG. 5 is a fragmentary, sectional view of the wafer after removal of a remaining $SiO_2$ auxiliary layer.
Figure 6:
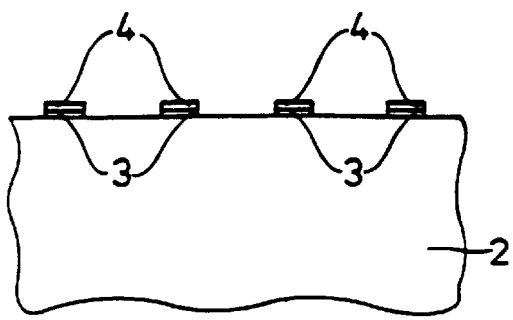
FIG. 6 is a fragmentary, sectional view of the wafer after structuring of the $SiO_2$ and $Si_3N_4$ layers lying underneath and subsequent removal of polysilicon spacers.

Referring now to the figures of the drawings in detail and first, particularly, to FIG. 1 thereof, there is seen a thin $SiO_2$ layer 3 and a $Si_3N_4$ layer 4 disposed on top of the layer 3, having a respective thickness of about 100 nm to 200 nm. The layers 3 and 4 are grown or whole-area deposited on a main area or surface 1 of a substrate 2 that is made, for example, of p-doped monocrystalline silicon. A CVD $SiO_2$ layer 5 serving as an auxiliary layer and having a thickness of about 300 nm to 400 nm is subsequently whole-area deposited and structured according to FIG. 2 through the use of customary photolithographic methods. According to FIG. 3, this layer 5 is followed by a whole-area deposition of a polysilicon layer 6 having a thickness of about 300 nm. The layer 6 is subsequently anisotropically etched back to produce a configuration that can be seen in FIG. 4. According to FIG. 5, this is followed by an isotropic removal of the structured CVD $SiO_2$ layer 5, preferably through the use of a chemical etchant such as, in particular, hydrofluoric acid. Spacers 7 formed of polysilicon are left behind and are used in a subsequent process step according to FIG. 5 as a "hard" mask for structuring the $Si_3N_4$ layer 4 lying underneath. After the structuring of the $Si_3N_4$ layer 4, the polysilicon spacers 7 are removed and the $Si_3N_4$ structure is transferred to the $SiO_2$ layer 3, preferably through the use of an anisotropic etchant, resulting in the structure shown in FIG. 6.

Figure 7:
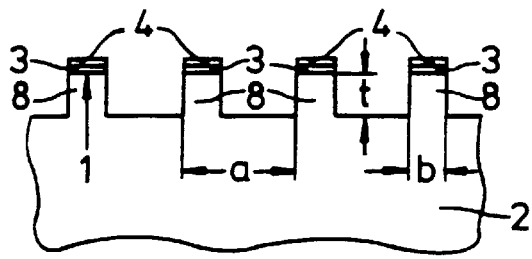
FIG. 7 is a fragmentary, sectional view of the wafer after structuring of the silicon substrate to produce source/drain webs.
Figure 8:
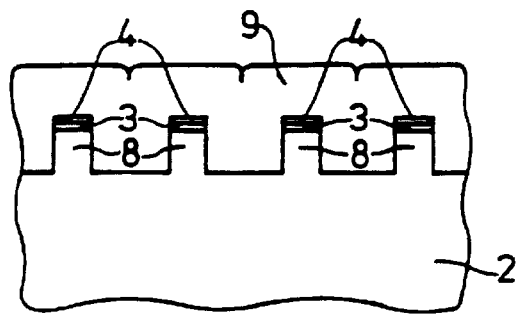
FIG. 8 is a fragmentary, sectional view of the wafer after conformal deposition and filling of a TEOS $SiO_2$ layer.

A composite including the structured $SiO_2$ and $Si_3N_4$ layers 3, 4 subsequently serves as a "hard" mask for the further structuring of the silicon substrate 2 according to FIG. 7. Source/drain webs 8 which are formed in this case run essentially parallel to one another at a predetermined spacing a, are electrically insulated from one another and have a depth t of about 400 nm, starting from the main surface or area 1 of the substrate 2. A ratio of a web width b to the spacing a between the source/drain webs 8 is about one third. According to FIG. 8, the entire configuration is subsequently filled with a conformally deposited TEOS $SiO_2$ layer 9, which has a thickness of about 600 nm to 800 nm, and then according to FIG. 9, it is etched back or ground back by a "Chemical Mechanical Polishing" process step.

Figure 9:
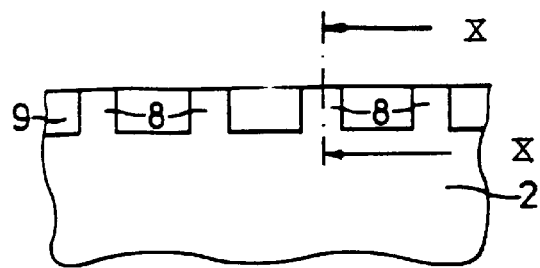
FIG. 9 is a fragmentary, sectional view of the wafer after etching back of the TEOS $SiO_2$ layer.

The following sectional views each show an orthogonal section with respect to a plane X—X according to FIG. 9.

Figure 10:
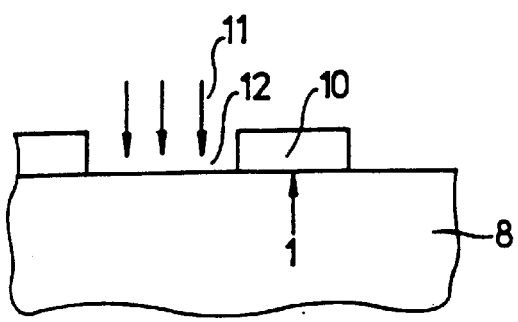
FIG. 10 is a fragmentary, sectional view of the wafer taken along a line X—X according to FIG. 9, for explaining programming of individual memory cells through the use of resist-masked ion implantation.

According to FIG. 10, a threshold voltage of memory cell transistors T (shown in FIG. 17) and also, if appropriate, of planar transistors which lie outside a cell field in a peripheral region and are not illustrated in greater detail, is subsequently defined through the use of an implantation step. For this purpose, a suitable implantation mask 10, for example in the form of a photoresist, is applied in each case to the main surface or area 1 and structured. A setting of the transistors is performed by a suitable selection of the dose of the implantation indicated by arrows 11. An opening 12 in the resist mask 10 should be F·F in a minimum case, in order to be able to absorb misalignment tolerances in following photolithography steps. The implantation can be carried out, for example, by using boron. It is possible, for example, for the implantation energy to be about 25 keV and the dose to be, for example, $1 \cdot 10^{12}$ cm$^{-3}$.

Figure 11:
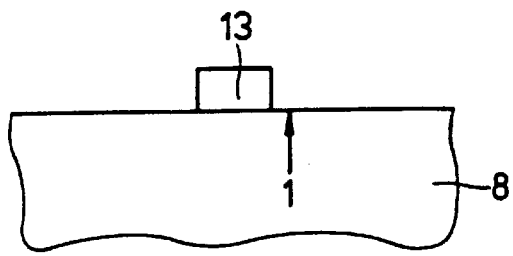
FIG. 11 is a fragmentary, sectional view of the wafer after deposition and structuring of a TEOS layer.
Figure 12:
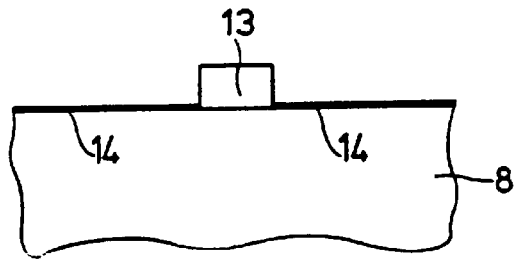
FIG. 12 is a fragmentary, sectional view of the wafer after deposition of an $SiO_2$/gate oxide.

A production of gate electrodes takes place through the use of a further self-aligning method step in a similar manner to the production of the source/drain webs. According to FIG. 11, a TEOS $SiO_2$ layer 13 serving as an auxiliary layer is again deposited and structured. This is followed by gate oxide deposition in the case of a mask-programmed read-only memory, or by ONO forming as in the case of a one-time electrically programmable read-only memory. In the case of the production of a gate oxide, the removal of the implantation mask is followed, for example, by thermal oxidation at 750°, for example. In this process, a thin gate oxide 14 having a scalable thickness of about 5 nm to 10 nm is formed on exposed silicon surfaces, resulting in a configuration illustrated in FIG. 12.

Figure 13:
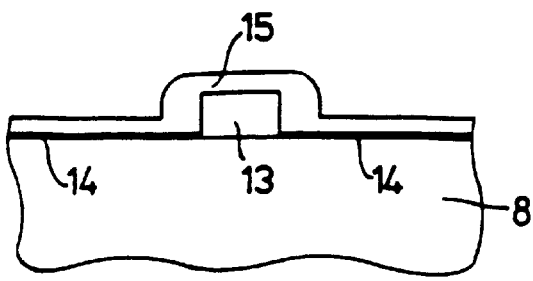
FIG. 13 is a fragmentary, sectional view of the wafer after deposition of a polysilicon layer, doping and annealing.
Figure 14:
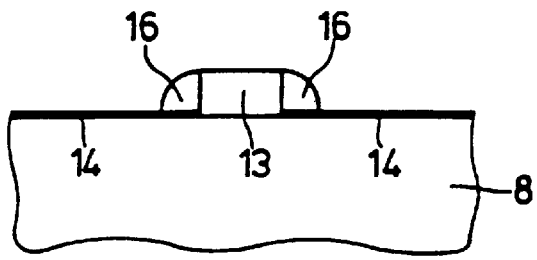
FIG. 14 is a fragmentary, sectional view of the wafer after anisotropic etching back of the polysilicon layer.
Figure 15:
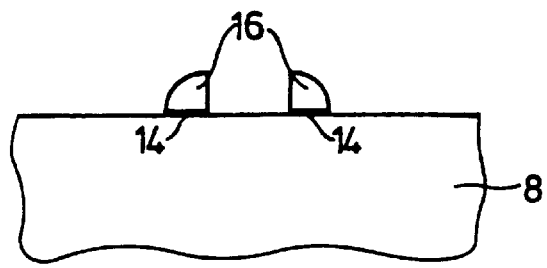
FIG. 15 is a fragmentary, sectional view of the wafer after removal of oxide layers.
Figure 16:
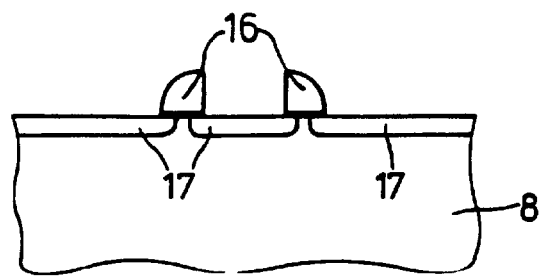
FIG. 16 is a fragmentary, sectional view of the wafer after carrying out ion implantation for the purpose of forming source/drain regions.
Figure 17:
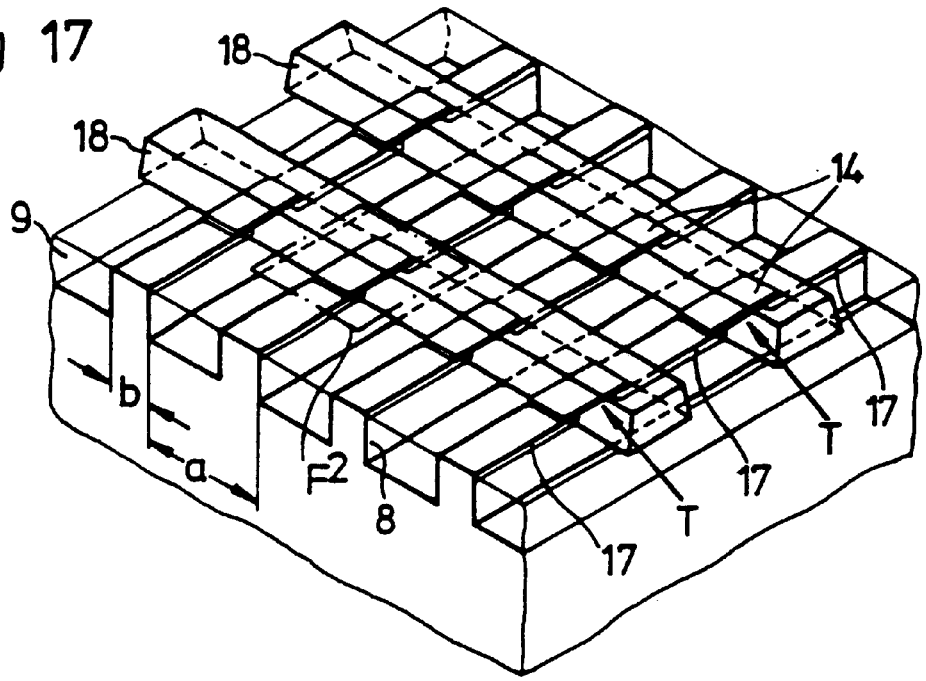
FIG. 17 is a fragmentary, perspective view of a read-only memory cell device according to an exemplary embodiment of the invention.

A polysilicon layer 15 is subsequently deposited according to FIG. 13, if appropriate it is doped by ion implantation or deposition and annealed, and it is subsequently anisotropically etched back according to FIG. 14. According to FIG. 15, the oxide layers 13 and 14 undergo dry removal, with the result that spacers 16 are left behind and are used as a "hard" mask for an ion implantation to form source/drain regions 17 seen in FIG. 16. The source/drain regions 17 are formed by implantation using, for example, arsenic at an energy of 50 keV and a dose of $5 \cdot 10^{15}$ cm$^{-3}$. Source/drain regions of MOS transistors in the periphery which are not illustrated in greater detail, can also be produced at the same time without a further additional mask. Moreover, further method steps which are known per se from MOS technology, such as setting an LDD profile, salicide technology and the like, can be carried out in order to produce all of the lateral MOS transistors in the cell field and in the peripheral region. After the removal of the spacers 16, word lines 18 for the connection of gate electrodes of the MOS transistors T are subsequently provided. This is done through the use of a customary metallization step, in such a way that they run transversely with respect to the longitudinal direction of the source/drain webs 8. FIG. 17 shows a fragmentary, perspective illustration of an exemplary embodiment of the configuration which is realized in this way.

Figure 18:
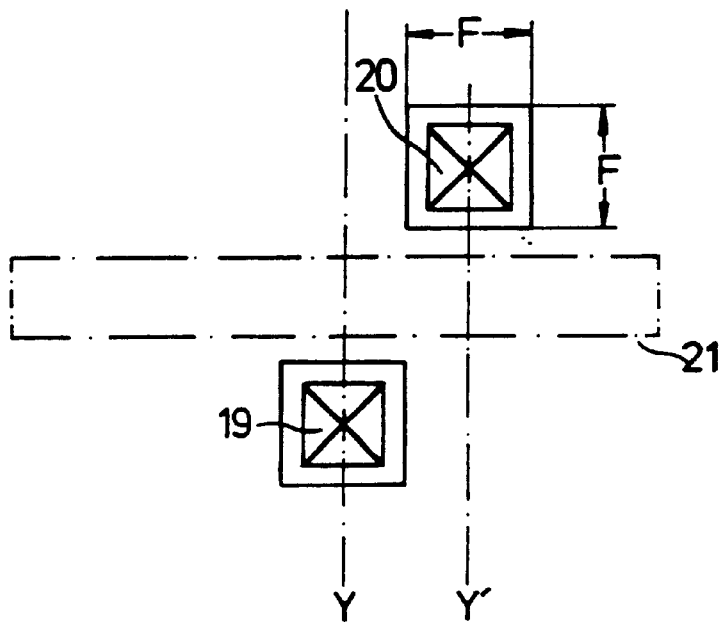
FIG. 18 is a plan view of the read-only memory cell device.

An interconnection of conductor tracks produced in this way using standard metallization, necessitates two additional process steps, which are explained in more detail with reference to FIG. 18. FIG. 18 shows a diagrammatic plan view of the configuration corresponding to the state according to FIG. 3. Positions of contact holes 19 and 20 for the connection of bit lines are indicated by reference symbols Y and Y' and a profile of a cell field is indicated by using a dot-dashed line 21. The contact holes once again have dimensions of F·F, where reference symbol F denotes the smallest structure size that can be produced or resolved with the respective technology and reference symbol $F^2$ denotes the base area.

We claim:

1. A read-only memory cell device, comprising:
   a substrate formed of semiconductor material and having a main area;
   bit lines and word lines;
   memory cells disposed in matrix form in columns and rows in a cell field in the vicinity of said main area, each of said memory cells having at least one MOS transistor with a source region, a drain region, a channel region, a gate dielectric and a gate electrode, said MOS transistors of a column connected in series one after the other, each column connected to a bit line and said gate electrodes of said MOS transistors of a row connected to a word line;

source/drain webs running substantially parallel to one another at a predetermined spacing, electrically insulated from one another, produced from said semiconductor material of said substrate and having a longitudinal direction and a predetermined web depth starting from said main area of said substrate, said source and drain regions of said MOS transistors of a column formed in said source/drain webs; and said word lines for connection of said gate electrodes of said MOS transistors running transversely relative to said longitudinal direction of said source/drain webs.

2. The read-only memory cell device according to claim 1, wherein said drain region, formed in said main area of a source/drain web, of an MOS transistor of a column, is simultaneously a source region of a MOS transistor of the same column directly adjacent on said source/drain web.

3. The read-only memory cell device according to claim 1, wherein said source/drain webs are spaced apart by a given spacing, said source/drain webs have a web width measured on said main area transversely relative to said longitudinal direction of said source/drain webs, and a ratio of said web width to said given spacing is about 20% to 40% of a resolvable structure size.

4. The read-only memory cell device according to claim 3, wherein said ratio of said web width to said given spacing is one third of said resolvable structure size.

5. The read-only memory cell device according to claim 1, wherein said memory cells are constructed on said main area of said substrate in a periodic configuration with a resolvable structure size F and precisely one memory cell assigned to every base area $F^2$.

6. The read-only memory cell device according to claim 1, wherein each of said MOS transistors of a memory cell formed on said main area of said source/drain webs is programmed as a depletion-mode transistor.

7. The read-only memory cell device according to claim 1, wherein each of said MOS transistors of a memory cell formed on said main area of said source/drain webs is programmed as an enhancement-mode transistor.

8. The read-only memory cell device according to claim 1, wherein said gate dielectric has a gate oxide and said read-only memory cell device is a mask-programmed read-only memory.

9. The read-only memory cell device according to claim 1, wherein said gate dielectric has an ONO forming material and said read-only memory cell device is a one-time electrically programmable read-only memory.

10. The read-only memory cell device according to claim 1, including an electrically insulating material filling a space region between said source/drain webs.

11. The read-only memory cell device according to claim 1, including a material containing $SiO_2$ filling a space region between said source/drain webs.

* * * * *